(12) United States Patent
Saeidi et al.

(10) Patent No.: US 9,041,192 B2
(45) Date of Patent: May 26, 2015

(54) HYBRID THERMAL INTERFACE MATERIAL FOR IC PACKAGES WITH INTEGRATED HEAT SPREADER

(75) Inventors: Seyed Mahdi Saeidi, Irvine, CA (US); Sam Ziqun Zhao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/598,291

(22) Filed: Aug. 29, 2012

(65) Prior Publication Data

US 2014/0061893 A1    Mar. 6, 2014

(51) Int. Cl.
| | |
|---|---|
| H01L 23/34 | (2006.01) |
| H01L 21/50 | (2006.01) |
| H01L 23/16 | (2006.01) |
| H01L 23/42 | (2006.01) |
| H01L 23/367 | (2006.01) |

(52) U.S. Cl.
CPC ....... *H01L 23/16* (2013.01); *H01L 2224/16225* (2013.01); *H01L 2224/32225* (2013.01); *H01L 2224/73204* (2013.01); *H01L 2224/73253* (2013.01); *H01L 2924/15311* (2013.01); *H01L 2924/16152* (2013.01); *H01L 23/3675* (2013.01); *H01L 23/42* (2013.01)

(58) Field of Classification Search
USPC ......... 257/678, 707, 704, 706, 712, 737, 738, 257/778, 717, 720, E23.101, 675, 713, 710, 257/783, E23.051, E21.511, E23.18, 257/E23.01
See application file for complete search history.

(56) References Cited

U.S. PATENT DOCUMENTS

| | | | | |
|---|---|---|---|---|
| 5,907,474 | A * | 5/1999 | Dolbear | 361/705 |
| 6,597,575 | B1 * | 7/2003 | Matayabas et al. | 361/705 |
| 7,168,484 | B2 * | 1/2007 | Zhang et al. | 165/185 |
| 7,704,798 | B2 * | 4/2010 | Hua et al. | 438/122 |
| 7,833,839 | B1 * | 11/2010 | Touzelbaev et al. | 438/122 |
| 7,906,857 | B1 * | 3/2011 | Hoang et al. | 257/783 |
| 7,928,562 | B2 * | 4/2011 | Arvelo et al. | 257/712 |
| 8,013,440 | B2 * | 9/2011 | Warren | 257/713 |
| 8,362,607 | B2 * | 1/2013 | Scheid et al. | 257/707 |
| 2003/0035269 | A1 * | 2/2003 | Chiu | 361/704 |
| 2004/0036183 | A1 * | 2/2004 | Im et al. | 257/796 |
| 2004/0188814 | A1 * | 9/2004 | Houle et al. | 257/678 |
| 2005/0141195 | A1 * | 6/2005 | Pokharna et al. | 361/699 |
| 2006/0043553 | A1 * | 3/2006 | Yang et al. | 257/678 |
| 2006/0109630 | A1 * | 5/2006 | Colgan et al. | 361/718 |
| 2006/0118969 | A1 * | 6/2006 | Yuan | 257/778 |
| 2006/0170094 | A1 * | 8/2006 | Subramanian et al. | 257/706 |
| 2006/0220225 | A1 * | 10/2006 | Ni et al. | 257/712 |
| 2006/0286719 | A1 * | 12/2006 | Ni et al. | 438/117 |
| 2007/0119582 | A1 * | 5/2007 | Zhang et al. | 165/183 |
| 2007/0270536 | A1 * | 11/2007 | Sachdev et al. | 524/440 |
| 2008/0001282 | A1 * | 1/2008 | Modi et al. | 257/710 |

(Continued)

*Primary Examiner* — Alexander Oscar Williams
(74) *Attorney, Agent, or Firm* — Fiala & Weaver P.L.L.C.

(57) ABSTRACT

Flip chip packages are described that include two or more thermal interface materials (TIMs). A die is mounted to a substrate by solder bumps. A first TIM is applied to the die, and has a first thermal resistance. A second TIM is applied to the die and/or the substrate, and has a second thermal resistance that is greater than the first thermal resistance. An open end of a heat spreader lid is mounted to the substrate such that the die is positioned in an enclosure formed by the heat spreader lid and substrate. The first TIM and the second TIM are each in contact with an inner surface of the heat spreader lid. A ring-shaped stiffener may surround the die and be connected between the substrate and heat spreader lid by the second TIM.

20 Claims, 6 Drawing Sheets

(56) References Cited

U.S. PATENT DOCUMENTS

| | | |
|---|---|---|
| 2010/0019377 A1* | 1/2010 | Arvelo et al. ............... 257/712 |
| 2010/0117222 A1* | 5/2010 | Too et al. .................... 257/704 |
| 2010/0308453 A1* | 12/2010 | Scheid et al. ............... 257/698 |
| 2010/0328895 A1* | 12/2010 | Bhagwagar et al. ......... 361/704 |
| 2011/0147916 A1* | 6/2011 | Su ............................. 257/692 |
| 2011/0156235 A1* | 6/2011 | Yuan .......................... 257/690 |
| 2011/0272119 A1* | 11/2011 | Bhagwagar et al. ..... 165/104.11 |
| 2011/0291258 A1* | 12/2011 | Murayama et al. ......... 257/712 |
| 2012/0043668 A1* | 2/2012 | Refai-Ahmed et al. ..... 257/777 |
| 2012/0175766 A1* | 7/2012 | Casey et al. ................ 257/712 |
| 2012/0218715 A1* | 8/2012 | Hirose et al. ............... 361/714 |
| 2012/0236502 A1* | 9/2012 | Yamaguchi et al. ......... 361/704 |
| 2012/0309132 A1* | 12/2012 | Gaynes et al. .............. 438/122 |
| 2013/0081796 A1* | 4/2013 | Horiuchi et al. ............ 165/185 |
| 2013/0119529 A1* | 5/2013 | Lin et al. .................... 257/704 |
| 2013/0188319 A1* | 7/2013 | Yamaguchi et al. ......... 361/717 |
| 2013/0208426 A1* | 8/2013 | Kim et al. ................... 361/717 |
| 2013/0214402 A1* | 8/2013 | Park et al. ................... 257/690 |
| 2013/0241044 A1* | 9/2013 | Kim et al. ................... 257/698 |
| 2013/0288319 A1* | 10/2013 | Weusthuis et al. .......... 435/139 |

\* cited by examiner 902
apply the second TIM to the first surface of the substrate to be separated from the die by a gap, the second TIM being connected between the first surface of the substrate and the inner surface of the heat spreader lid
FIG. 9
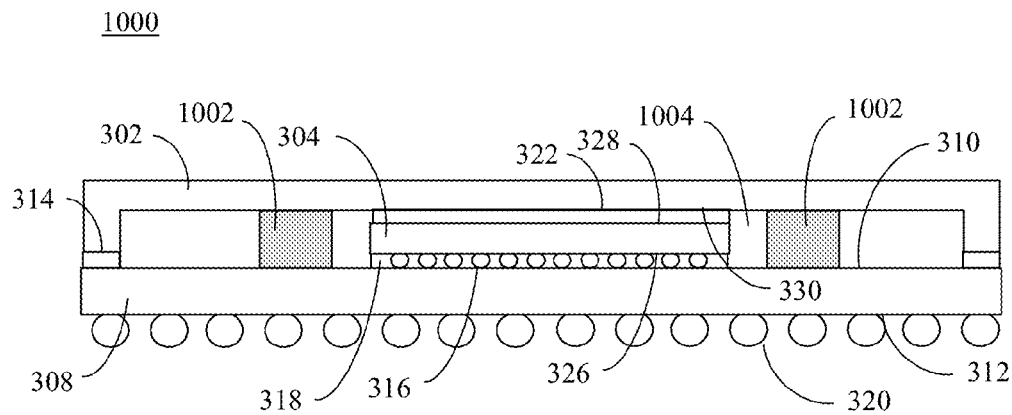
FIG. 10
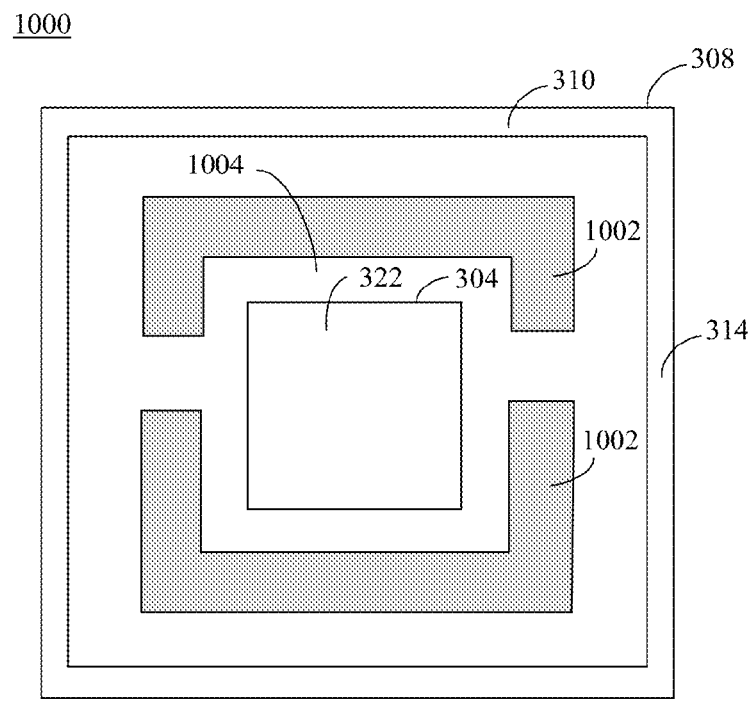
FIG. 11

HYBRID THERMAL INTERFACE MATERIAL FOR IC PACKAGES WITH INTEGRATED HEAT SPREADER

BACKGROUND

1. Field of the Invention

The present invention relates to integrated circuit packaging technology.

2. Background Art

Integrated circuit (IC) chips or dies from semiconductor wafers are typically interfaced with other circuits using a package that can be attached to a printed circuit board (PCB). One such type of IC package is a ball grid array (BGA) package. BGA packages provide for smaller footprints than many other package solutions available today. A BGA package includes a die attached to substrate of the package, and an array of solder ball pads located on a bottom external surface of the package substrate. Solder balls are attached to the solder ball pads. The solder balls are reflowed to attach the package to the PCB.

In some BGA packages, signals of the die are interfaced with electrical features (e.g., bond fingers) of the substrate using wire bonds. In such a BGA package, wire bonds are connected between signal pads/terminals of the die and electrical features of the substrate. In another type of BGA package, which may be referred to as a "flip chip package," a die may be attached to the substrate of the package in a "flip chip" orientation. In such a BGA package, solder bumps are formed on the signal pads/terminals of the die, and the die is inverted ("flipped") and attached to the substrate by reflowing the solder bumps so that they attach to corresponding pads on the surface of the substrate.

Typically IC packages are asymmetrical (in the direction perpendicular to the plane of the substrate), and are mechanically unbalanced. This asymmetry, along with the different materials used in the packaging (e.g., an organic package substrate, which has a different coefficient of thermal expansion (CTE) than the IC die), cause both mechanical and thermal stresses, which in turn lead to package warpage and co-planarity issues. Package warp can place stress on the solder joints of the die, leading to detachment of some of the solder bumps and/or physical damage to the die. Thus, flip chip packages are frequently configured to disperse the generated heat, such as though the inclusion of heat sinks. For instance, a heat spreader in the form of a cap may be mounted to a package over the die to aid in dispersing excess heat and to reducing package warping. The die may be interfaced with the heat spreader by an adhesive that conducts heat from the die to the heat spreader. However, properties of the adhesive material determine whether the adhesive is more effective at transferring heat from the die to the heat spreader, or is more effective at adhering to the heat spreader in a manner that enhances package strength and thereby reduces package warping. Current adhesive materials tend to be effective at heat transfer or at warp prevention, but are not highly effective at both.

BRIEF SUMMARY

Methods, systems, and apparatuses are described for flip chip packages that include two or more different thermal interface materials used to transfer heat from dies to heat spreaders and to enhance package mechanical strength/rigidity, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

FIG. 9 shows a process that may be performed during the flowchart of FIG. 4 to form a flip chip package that includes a first TIM that adheres a flip chip die to a heat spreader lid, and a second TIM that adheres a package substrate to the heat spreader lid, according to an example embodiment.

FIG. 10 shows a cross-sectional side view of a flip chip package that includes a first TIM that adheres a flip chip die to a heat spreader lid, and a second TIM that adheres a package substrate to the heat spreader lid, according to an example embodiment.

FIG. 11 shows a top view of a flip chip package that has a first TIM on a flip chip die surface, and a second TIM on a package substrate surface (with a heat spreader lid of the flip chip package not visible), according to an example embodiment.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Embodiments

A "flip chip package" is a type of ball grid array (BGA) package that packages one or more integrated circuit dies. In a flip chip package, solder bumps are formed on the signal pads/terminals of a die, and the die is inverted ("flipped") and attached to the substrate of the package by reflowing the solder bumps so that they attach to corresponding pads on the surface of the substrate. This inverted orientation of the die on the substrate is referred to as a "flip chip" orientation.

Figure 1:
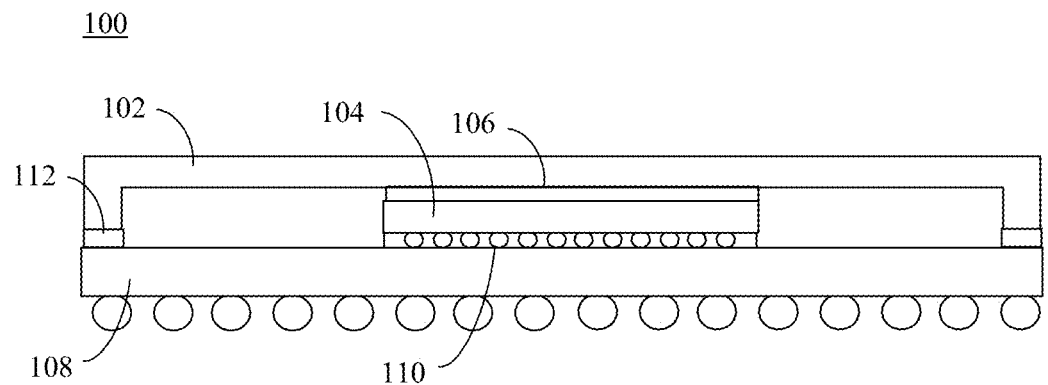
FIG. 1 shows a cross-sectional side view of an example flip chip package.

FIG. 1 shows a cross-sectional side view of an example flip chip package 100. As shown in FIG. 1, flip chip package 100 includes a heat spreader lid 102, an integrated circuit die/chip 104, an adhesive 106, a substrate 108, a plurality of solder bumps/balls 110, and an adhesive 112. As shown in FIG. 1, die 104 is mounted to substrate 108 by solder bumps/balls 110. Heat spreader lid 102 is mounted to substrate 108 over die 104. Adhesive 112 attaches a rim of a heat spreader lid 102 to substrate 108. Adhesive 106 is present on a top surface of die 104 to interface die 104 with an inner surface of heat spreader lid 102.

Typically IC packages are asymmetrical (in the direction perpendicular to the plane of the substrate), and are mechanically unbalanced. This asymmetry, along with the different materials used in the packaging (e.g., an organic package substrate, which has a different coefficient of thermal expansion (CTE) than the IC die), cause both mechanical and thermal stresses, which in turn lead to package warpage and co-planarity issues.

Figure 2:
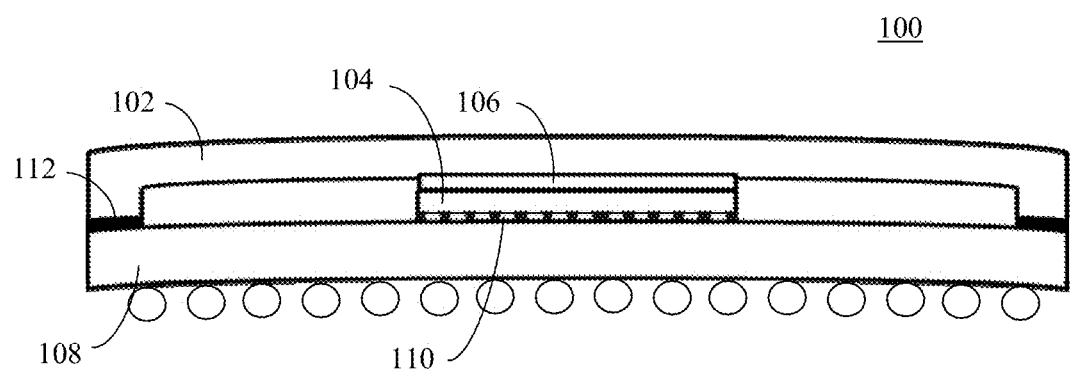
FIG. 2 shows a cross-sectional side view of the flip chip package of FIG. 1 undergoing package warp due to heat generated during operation.

For instance, FIG. 2 shows a cross-sectional side view of flip chip package 100 of FIG. 1 warping due to heat generated by die 104 during operation. As shown in FIG. 1, both substrate 108 and heat spreader lid 102 are warped (e.g., curving concave downward in FIG. 1) due to thermal expansion from heat output by die 104. Such package warp can place stress on the solder joints of die 104, such as at solder bumps 110, leading to detachment of some of solder bumps 110 and/or physical damage to the die. Furthermore, such package warp can cause detachment (e.g., delamination) of die 104 from heat spreader lid 102 by adhesive 106, enabling further warping of flip chip package 100.

Heat spreader lid 102 may be present in package 100 to aid in dispersing excess heat from die 104 and therefore to reducing warping of package 100. Die 104 is interfaced with heat spreader lid 102 by adhesive 106, which may be selected to have low thermal resistance (e.g., low resistance to heat transfer) to efficiently conduct heat from die 104. However, due to the limitations of current adhesive materials, if adhesive 106 has low thermal resistance, adhesive 106 will conversely tend to have a low "modulus." "Modulus" indicates a stiffness property of an adhesive. A high modulus means that the adhesive material is relatively stiff (is relatively hard when the adhesive material cures) and is a stronger adhesive, and a low modulus means that the adhesive material is less stiff (e.g., is more pliable when the adhesive material cures) and is a weaker adhesive. Adhesives with lower thermal resistance (relatively high heat conductance) tend to have a lower modulus (are relatively less stiff/more pliable), and adhesives with higher thermal resistance (relatively lower heat conductance) tend to have a high modulus (relatively more stiffness pliable). If adhesive 106 has relatively low thermal resistance, and therefore a low modulus, adhesive 106 may not strongly adhere die 104 to heat spreader lid 102. This leads to greater flexing of heat spreader lid 102, and therefore to greater package warping. Current adhesive materials typically are effective at heat transfer or warp prevention, but are not highly effective at both.

Embodiments, overcome these current problems with adhesives. In embodiments, two or more thermal interface materials/adhesives are used in an integrated circuit package to enable both efficient heat transfer and reduced package warp. Although embodiments are frequently described herein with respect to flip chip packages, in embodiments, two or more thermal interface materials/adhesives may be used in other types of integrated circuit packages, such as other types of BGA packages, pin grid array (PGA) packages, quad flat pack (QFP) packages, and further types of integrated circuit packages, to enable efficient heat transfer and reduced package warp.

Figure 3:
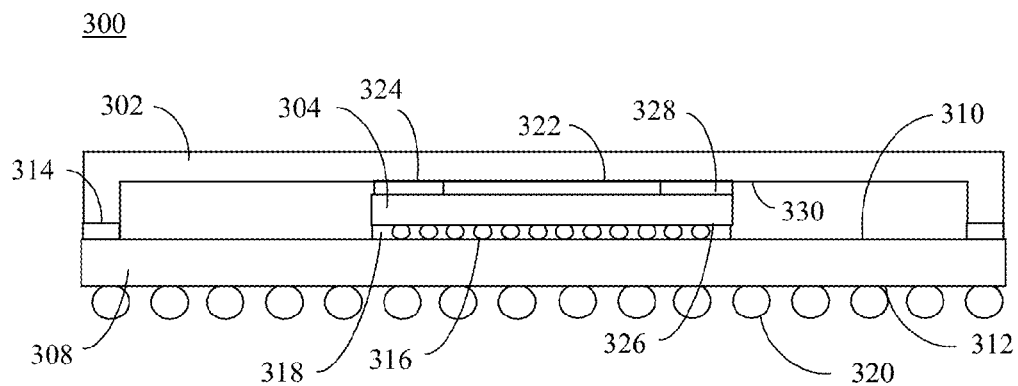
FIG. 3 shows a cross-sectional side view of a flip chip package that includes a heat spreader lid attached by first and second thermal interface materials (TIMs), according to an example embodiment.

Embodiments may be configured in various ways. For instance, FIG. 3 shows a side cross-sectional view of a flip chip package 300, according to an example embodiment. Flip chip package 300 may be a plastic BGA (PBGA) package, a flex BGA package, a ceramic BGA package, or other type of flip chip BGA package. Flip chip package 300 includes a heat spreader lid 302, an integrated circuit die/chip 304, a substrate 308, an adhesive 314, a plurality of solder bumps/balls 316, an underfill material 318, a plurality of solder balls 320, a first thermal interface material (TIM) 322, and a second TIM 324. Package 300 is described as follows.

Substrate 308 has a first (e.g., top) surface 310 that is opposed to a second (e.g., bottom) surface 312 of substrate 308. Substrate 308 may include one or more electrically conductive layers (such as at first surface 310) that are separated by one or more electrically insulating layers. An electrically conductive layer may include traces/routing, bond fingers, contact pads, and/or other electrically conductive features. For example, BGA substrates having one electrically conductive layer, two electrically conductive layers, or four electrically conductive layers are common. The electrically conductive layers may be made from an electrically conductive material, such as a metal or combination of metals/alloy, including copper, aluminum, tin, nickel, gold, silver, etc. In embodiments, substrate 308 may be rigid or may be flexible (e.g., a "flex" substrate). The electrically insulating layer(s) may be made from ceramic, plastic, tape, and/or other suitable materials. For example, the electrically insulating layer(s) of substrate 308 may be made from an organic material such as BT (bismaleimide triazine) laminate/resin, a flexible tape material such as polyimide, a flame retardant fiberglass composite substrate board material (e.g., FR-4), etc. The electrically conductive and non-conductive layers can be stacked and laminated together, or otherwise attached to each other, to form substrate 308, in a manner as would be known to persons skilled in the relevant art(s).

As shown in FIG. 3, die 304 has opposing first and second surfaces 326 and 328 (e.g., bottom and top surfaces in FIG. 3). Die 304 is attached to substrate 308 in a "flip chip" manner. Solder bumps 316 or any other electrically conductive feature (e.g., solder balls, etc.) are formed on the signal pads/terminals of die 304 and/or on corresponding pads on surface 310 of substrate 308. Die 304 is attached to substrate 308 in an inverted ("flipped") orientation with respect to the attachment of dies in wire bond BGA package configurations. In such an orientation, the active surface of die 304 faces substrate 308. Die 304 is attached to substrate 308 by reflowing solder bumps 316 so that solder bumps 316 attach to corresponding pads on surface 310 of substrate 308. Although not visible in FIG. 3, surface 310 of substrate 308 has a mounting region for a flip chip die. The mounting region includes an array of solder ball/bump pads corresponding to solder bumps 316. Any number of pads may be present in the mounting region, depending on the number of solder bumps 316 on the flip chip die to be mounted thereto. When die 304 is mounted to the mounting region, solder bumps 316 attach to pads of the array on substrate 308.

Underfill material 318 may be optionally present, as shown in FIG. 3. Underfill material 318 fills in a space between die 304 and substrate 308 between solder bumps 316. Underfill material 318 may be an epoxy or any other suitable type of underfill material, as would be known to persons skilled in the relevant art(s).

A plurality of solder balls 320 is attached to second surface 312 of substrate 308 (e.g., by a ball mounting process). Solder balls 320 attach to an array of solder ball pads (not visible in FIG. 3) on second surface 312 of substrate 308. Any number of solder ball pads may be present on second surface 312 for receiving solder balls 320, and the array may be arranged in any number of rows and columns. Note that the array of solder ball pads may be lacking some pads so that a full array of solder balls 320 on second surface 312 is not necessarily present. The solder ball pads are electrically coupled through substrate 308 (e.g., by electrically conductive vias and/or routing) to the electrically conductive features (e.g., traces, bond fingers, contact regions, etc.) of first surface 310 of substrate 308 to enable signals of die 304 to be electrically connected to solder balls 320 through substrate 308.

An open end of heat spreader lid 302 is mounted to first surface 310 of substrate 308 over die 304 so that die 304 is positioned in an enclosure formed by heat spreader lid 302 and substrate 308. Heat spreader lid 302 encloses die 304 from the top side and lateral sides (surfaces that are perpendicular to surface 310 of substrate 308), while substrate 308 covers the open end of heat spreader lid 302 below die 304 in FIG. 3. For instance, heat spreader lid 302 may have the shape of a frame or ring (e.g., a rectangular ring, a circular ring, or other ring shape) that has an open end that is opposed to a solid/closed end (a covered/lid end). As such, in an embodiment, heat spreader lid 302 may have the shape of a relatively flat box that has one opened end. Die 304 is positioned on substrate 308 within a recess or cavity in heat spreader lid 302 that is accessible at the open end of heat spreader lid 302.

Heat spreader lid 302 may be present to provide environmental protection for die 304, EMI shielding for die 304, as well as warp reduction for package 300. Heat spreader lid 302 may be made from a metal, such as stainless steel (e.g., 0.007 inch thick) and/or other material.

As shown in FIG. 3, first and second TIMs 322 and 324 are both in contact with surface 328 of die 304 and with an inner surface 330 of heat spreader lid 302. Inner surface 330 is a central surface within the cavity formed by heat spreader lid 302 (facing downward in FIG. 3). First and second TIMs 322 and 324 are adhesives that adhere die 304 to heat spreader lid 302, and transfer heat from die 304 to heat spreader lid 302 during operation of die 304. First TIM 322 is arranged on surface 328 of die 304 in a first pattern, and second TIM 324 is arranged on surface 328 of die 304 in a second pattern. First and second TIMs 322 and 324 are co-planar and are not vertically overlapping.

Furthermore, first TIM 322 has a first thermal resistance, and second TIM 324 has a second thermal resistance that is greater than the first thermal resistance of first TIM 322. As such, first TIM 322 conducts heat from die 304 to heat spreader lid 302 more efficiently than second TIM 324, and can achieve a lower junction temperature at the interface of die 304 with heat spreader lid 302. Still further, second TIM 324 has a first modulus (e.g., mechanical stiffness or rigidity) that is greater than a second modulus of the first TIM 322. As such, first TIM 322 may be present between die 304 and heat spreader lid 302 to provide efficient thermal transfer between die 304 and heat spreader lid 302, and second TIM 324 may be present between die 304 and heat spreader lid 302 to provide better adhesion between die 304 and heat spreader lid 302 and therefore reduced package warping. The presence of both first and second TIMs 322 and 324 in package 300 enables relatively high thermal transfer and relatively high package stiffness, as compared to conventional packages that include a single adhesive that provides either high heat transfer or high warp reduction, but not both.

First and second TIMs 322 and 324 can each be formed of a material such as an epoxy, an adhesive gel, a glue, a solder, or another type of thermal interface material. In one embodiment, first TIM 322 may be an adhesive gel. An adhesive gel may be configured for relatively lower thermal resistance (e.g., may include thermally conductive particles, such as metal particles (e.g., silver particles, gold particles, etc.)) compared to some other materials, such as epoxies, for greater heat transfer. When used as a TIM, an adhesive gel may be applied and cured to form cross-linked polymers, becoming less viscous and providing adhesive properties of the adhesive gel.

In an embodiment, second TIM 322 may be an epoxy (e.g., a thermosetting polymer), which can be more rigid and adhesive than some other materials (e.g., adhesive gels), providing greater stiffness to a package, and less chance of delamination of the die from the heat spreader lid. When used as a TIM, an epoxy may be applied and cured to polymerize the epoxy, becoming harder and providing adhesive properties of the adhesive gel.

For instance, in one example, first TIM 322 may be X23-7772-4 gel from Shin-Etsu, which has relatively lower thermal resistance (0.25° Ccm$^2$/W), but relatively lower modulus (0.0004 GPa). Furthermore, second TIM 322 may be SE4450 epoxy from Dow-Corning, which has relatively higher modulus (0.005 GPa), but relatively higher thermal resistance (0.5° Ccm$^2$/W). SE4450 epoxy has a thermal resistance that is 2 times larger than the thermal resistance of X23-7772-4, but provides less package warp. By using these types of TIMs together in a same flip chip package, greater thermal transfer may be achieved, while also achieving greater package stiffness.

Figure 4:
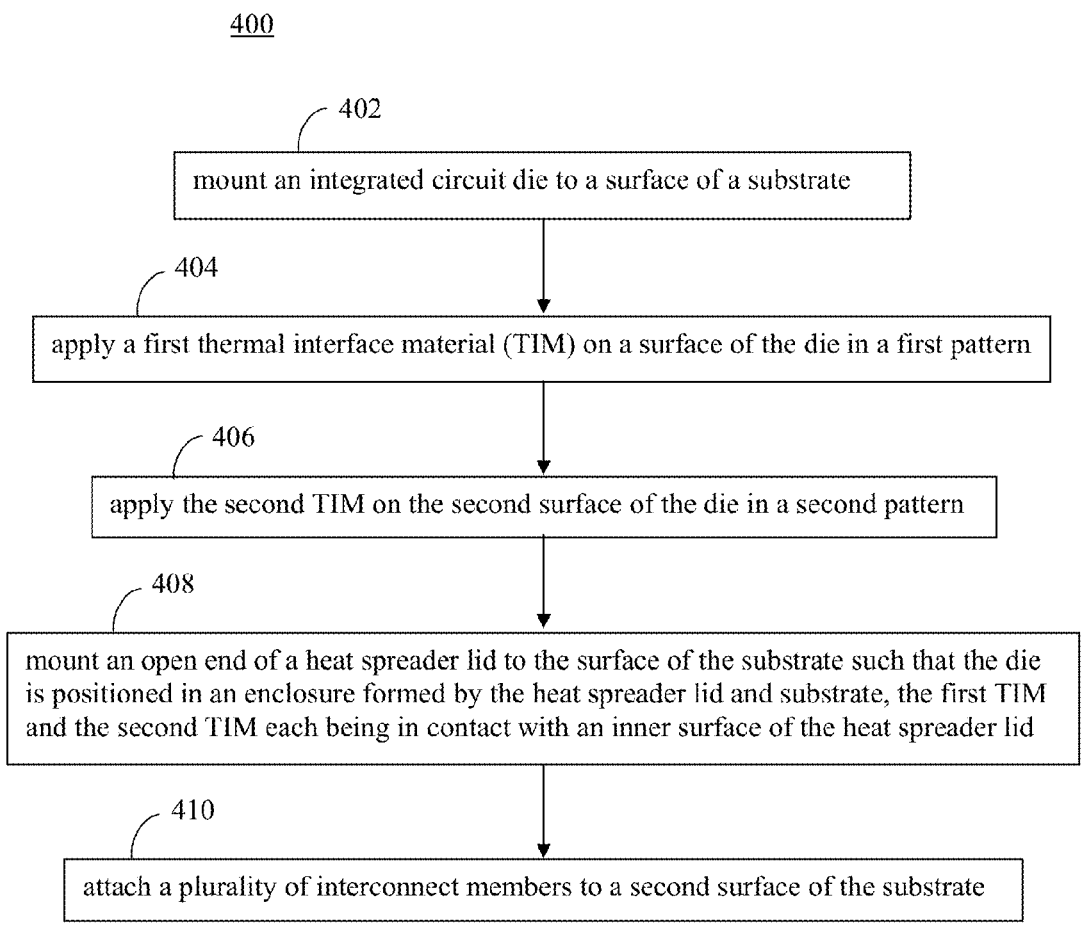
FIG. 4 shows a flowchart of a process for forming a flip chip package that includes a heat spreader lid attached by first and second TIMs, according to an example embodiment.

A package that contains two or more TIMs may be fabricated in various ways. For instance, FIG. 4 shows a flowchart 400 of a process for forming a flip chip package that includes a heat spreader lid attached by first and second TIMs, according to an example embodiment. Flip chip package 300 may be assembled according to flowchart 400, for example. Note that the steps of flowchart 400 do not necessarily need to be performed in the order shown. Flowchart 400 is described as follows with reference to flip chip package 300 of FIG. 3, for purposes of illustration.

Flowchart 400 begins with step 402. In step 402, an integrated circuit die is mounted to a surface of a substrate. For example, as shown in FIG. 3, die 304 may be mounted to surface 310 of substrate 308. Die 304 may be applied to surface 310 in any manner, such as by a pick-and-place machine or other mechanism. Solder may be applied to terminals on surface 326 of die 304 and/or on pads on surface 310 of substrate 308, die 304 may be aligned with the pads on surface 310, and the solder may be reflowed to form solder bumps 316 and attach die 304 to substrate 308. Underfill material 318 may be applied in any manner to encapsulate solder bumps 316 under die 304, including according to proprietary or conventional techniques (e.g., being applied and cured, etc.).

In step 404, a first thermal interface material (TIM) is applied on a surface of the die in a first pattern. For instance, as shown in FIG. 3, first TIM 322 may be applied to surface 328 of die 304. First TIM 322 may be applied in any manner, including by a conventional or proprietary adhesive dispenser. As further described below, first TIM 322 may be applied in any pattern on surface 328 of die 304. Note that in an alternative embodiment, first TIM 322 may be alternatively or additionally applied on inner surface 330 of heat spreader lid 302.

In step 406, the second TIM is applied on the second surface of the die in a second pattern. For instance, as shown in FIG. 3, second TIM 324 may be applied to surface 328 of die 304. Second TIM 324 may be applied in any manner, including by a conventional or proprietary adhesive dispenser. As further described below, second TIM 324 may be applied in any pattern on surface 328 of die 304. Note that in an alternative embodiment, second TIM 324 may be alternatively or additionally applied on inner surface 330 of heat spreader lid 302.

As described above, first and second TIMs 324 may be applied in any suitable patterns. Such patterns may be complimentary or interlocking, such that the entirety of surface 328 of die 304 is covered, or such that one or more portions of surface 328 of die 304 are not covered. Furthermore, one or one additional patterns of one or more further TIMs may be applied on surface 328. Example TIM patterns include rectangular patterns, circular patterns, oval patterns, elliptical patterns, triangular patterns, strip patterns, ring shaped patterns, irregularly shaped patterns, other polygonal patterns, etc. The example TIM patterns described herein (or otherwise known) may be combined or used together in any combination.

Figure 5:
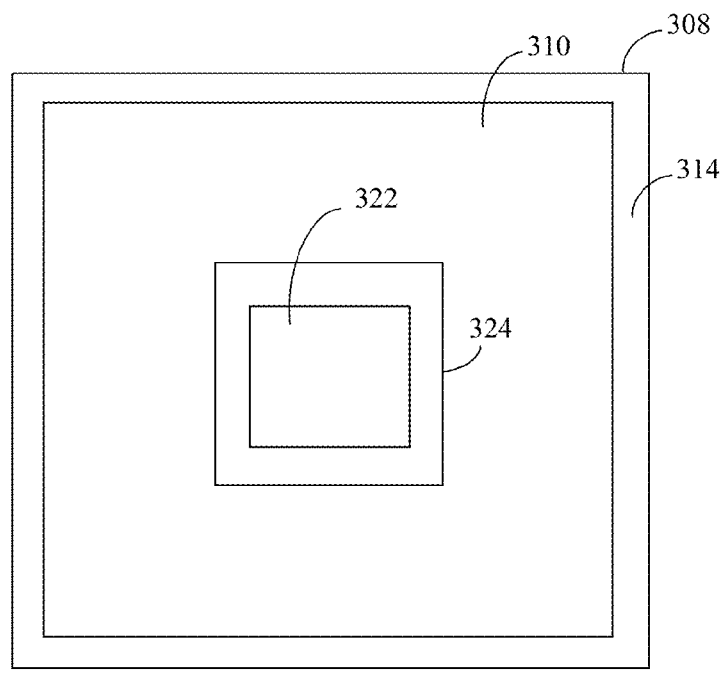
FIGS. 5-8 show top views of flip chip packages that have two or more TIMs formed on a die in corresponding example patterns (with heat spreader lids not visible), according to example embodiments.

For instance, FIGS. 5-8 show top views of flip chip packages that include two or more TIMs in corresponding example patterns, and with heat spreader lids not visible, according to example embodiments. FIG. 5 shows a top view of a flip chip package 500. As shown in FIG. 5, surface 310 of substrate 308 is visible. Adhesive 314 is shown in a rectangular ring-shaped pattern along the perimeter edges of surface 310. Adhesive 314 is configured to attach a rim of a heat spreader lid, such as heat spreader lid 302 of FIG. 3, to substrate 308. A heat spreader lid is not visible in FIGS. 5-8.

First TIM 322 covers a first portion of the die surface (e.g., surface 328 of die 302, which is not visible in FIG. 3) in a first pattern, and second TIM 324 covers a second portion of the die surface in a second pattern. In the example of FIG. 5, the first pattern of first TIM 322 is a centrally located rectangular pattern (e.g., located over a center of the surface of the die). and the second pattern of second TIM 324 is a perimeter rectangular ring-shaped pattern that surrounds the first pattern of first TIM 322 (e.g., along the four perimeter edges of the die surface). First and second TIMs 322 and 324 adhere an inner central region of a heat spreader lid (e.g., inner surface 330 of heat spreader lid 302 of FIG. 3) to the die surface.

In the embodiment of FIG. 5, greater thermal transfer from the center of the die to the heat spreader lid is enabled by first TIM 322, which has a lower thermal resistance than second TIM 324. This may be useful, because a die typically generates more heat at or near its center (location of more active circuitry) relative to perimeter regions of the die surface. Furthermore, greater adhesion to the heat spreader lid and greater stiffness is provided at the perimeter edges of the die by second TIM 324, which has a greater modulus than first TIM 322. This may be useful to provide greater stiffness and reduced warping for package 300 by providing a more rigid material along the edges and at each corner of the die surface.

Figure 6:
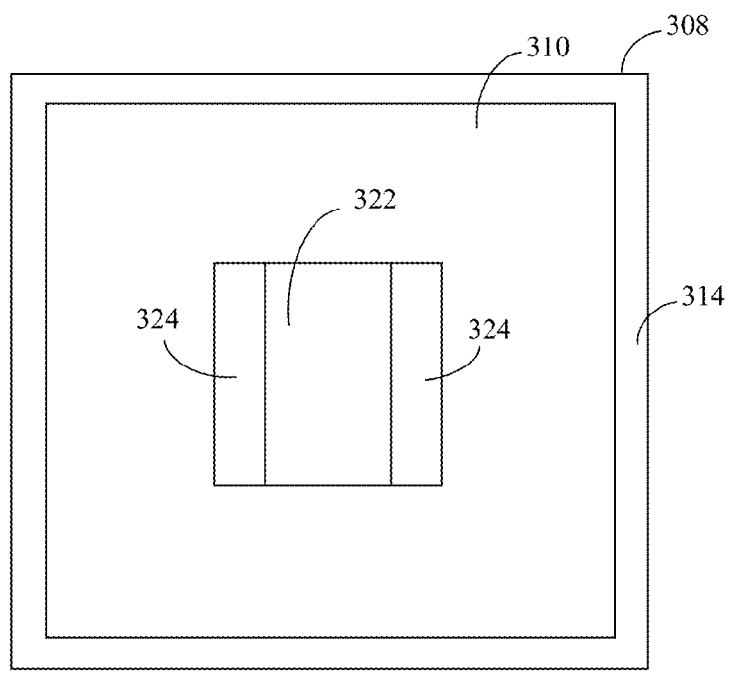

FIG. 6 shows a top view of a flip chip package 600. As shown in FIG. 6, surface 310 of substrate 308 is visible. Adhesive 314 is shown in a rectangular ring-shaped pattern along the perimeter edges of surface 310 (to attach a heat spreader lid). First TIM 322 covers a first portion of the die surface in a first pattern, and second TIM 324 covers a second portion of the die surface in a second pattern. In the example of FIG. 6, the first pattern of first TIM 322 is a first rectangular shaped pattern that extends across a central region of die surface, from edge-to-opposite edge of the die surface, and the second pattern of second TIM 324 includes second and third rectangular shaped patterns. The second and third rectangular shaped patterns extend along opposing edges of the die surface (from corner-to-corner). The first rectangular shaped pattern of TIM 322 is between the second and third rectangular shaped patterns of the TIM 324. First and second TIMs 322 and 324 both the die surface to an inner central region of a heat spreader lid.

In the embodiment of FIG. 6, greater thermal transfer edge-to-edge across the center of the die to the heat spreader lid is enabled by first TIM 322, which has a lower thermal resistance than second TIM 324. Furthermore, greater adhesion to the heat spreader lid and greater stiffness is provided by TIM 324 along the two opposing perimeter edges of the die covered by TIM 324 and at each corner of the die surface, because TIM 324 has a greater modulus than first TIM 322.

Figure 7:
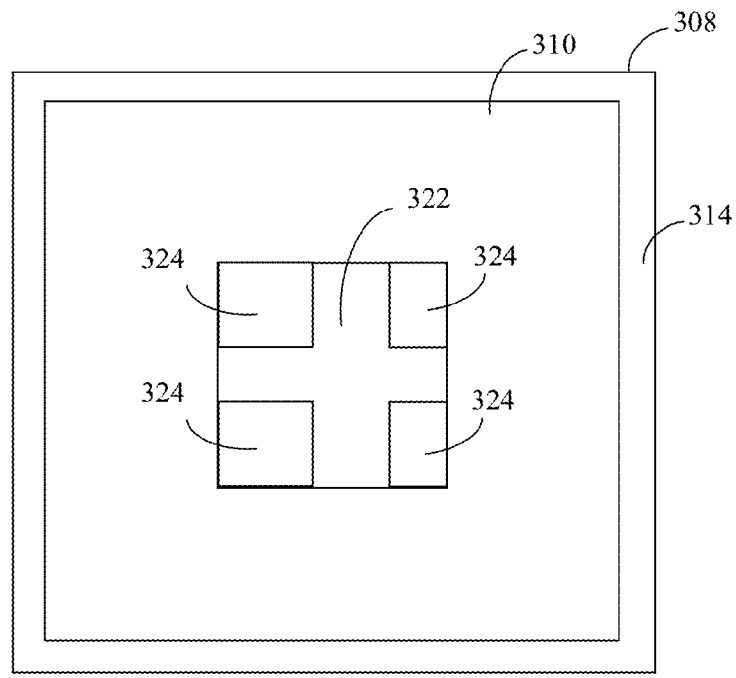

In another embodiment, a higher modulus TIM may be patterned at one or more corners of a die surface. For instance, FIG. 7 shows a top view of a flip chip package 700. As shown in FIG. 7, surface 310 of substrate 308 is visible. Adhesive 314 is shown in a rectangular ring-shaped pattern along the perimeter edges of surface 310 (to attach a heat spreader lid). First TIM 322 covers a first portion of the die surface in a first pattern, which is a cross-shaped pattern on a central region of the die surface that extends to each edge of the die surface, and second TIM 324 covers a second portion of the die surface in a second pattern, which includes a rectangular shape at each corner of the die surface. First and second TIMs 322 and 324 adhere the die surface to an inner central region of a heat spreader lid.

In the embodiment of FIG. 7, greater thermal transfer from the center of the die to the heat spreader lid is enabled by first TIM 322, which has a lower thermal resistance than second TIM 324. Furthermore, greater adhesion to the heat spreader lid and greater stiffness is provided at each corner of the die surface by second TIM 324, which has a greater modulus than first TIM 322.

Figure 8:
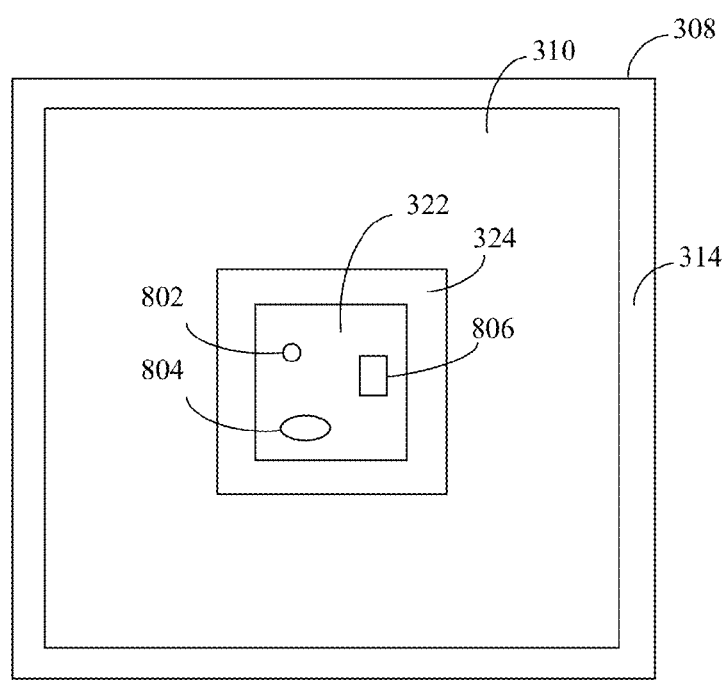

FIG. 8 shows a top view of a flip chip package 800. As shown in FIG. 8, surface 310 of substrate 308 is visible. Adhesive 314 is shown in a rectangular ring-shaped pattern along the perimeter edges of surface 310 (to attach a heat spreader lid). First TIM 322 covers a first portion of the die surface in a first pattern, which is a centrally located rectangular region on the die surface, and second TIM 324 covers a perimeter rectangular ring-shaped pattern that surrounds the first pattern of first TIM 322 (e.g., along the four perimeter edges of the die surface). Furthermore, a circular shaped third TIM 802, an oval shaped fourth TIM 804, and a rectangular shaped fifth TIM 806 are each present within the rectangular pattern of first TIM 322. First-fifth TIMs 322, 324, 802, 804, and 806 adhere the die surface to an inner central region of a heat spreader lid.

In the embodiment of FIG. 8, greater thermal transfer from the center of the die to the heat spreader lid is enabled by first TIM 322, which has a lower thermal resistance than second TIM 324. Furthermore, third-fifth TIMs 802, 804, and 806 may be located over corresponding hot spots of the die. For instance, in an embodiment, a heat map may be generated for the die (e.g., by measuring heat during operation, by identifying high-power functional blocks of the die, etc.), and one or more hot spots on the die surface may be identified based on the heat map. TIMs with relatively low thermal resistance may be selected to be applied to the die surface at the identified hot spots. For instance, the positions of third-fifth TIMs 802, 804, and 806 on the die surface may correspond to three determined hot spots.

Still further, greater adhesion to the heat spreader lid and greater stiffness is provided around the perimeter of the die surface by second TIM 324, which has a greater modulus than first TIM 322.

For instance, in an embodiment provided for purposes of illustration, first TIM 322 may be an adhesive gel, second TIM 324 may be an epoxy, and third-fifth TIMS 802, 804, and 806 may be solder. Solder has very high thermal transfer (low thermal resistance) (e.g., higher than adhesive gels and epoxies) and very high modulus (very stiff) (higher than adhesive gels and epoxies). However, because solder is very stiff when solidified and has a high coefficient of thermal expansion (CTE), if solder is applied to a large area of surface 328 of die 304, the solder can cause a large amount of stress and damage to die when heated during operation of die 304. As such, in an embodiment, a small amount of solder may be applied directly to hotspots of die 304, such as at the locations of third-fifth TIMS 802, 804, and 806, to provide very high thermal transfer at the hotspots. First TIM 322 may be applied as shown in FIG. 8 to provide generally high thermal transfer around the rest of the central region of surface 328 of die 304 (without being overly stiff and causing damage to die 304). Second TIM 324 may be applied around the perimeter of surface 328 of die 304 to provide sufficient rigidity and adhesiveness to heat spreader lid 302 to reduce package warping.

Referring back to FIG. 4, in step 408, an open end of a heat spreader lid is mounted to the surface of the substrate such that the die is positioned in an enclosure formed by the heat spreader lid and substrate, the first TIM and the second TIM each being in contact with an inner surface of the heat spreader lid. For example, as shown in FIG. 3, the open end of heat spreader lid 302 (the lower end in FIG. 3) may be mounted to surface 310 of substrate 308 by adhesive 314. Adhesive 314 may be applied to surface 310 in a ring, and/or may be applied to a rim of heat spreader lid 302 around the open end, and the rim of heat spreader lid 302 may be mounted to surface 310. Adhesive 314 may be cured, if applicable. Any suitable adhesive material may be used for adhesive 314, including an epoxy, an adhesive gel, a glue, a solder, etc., including a TIM described elsewhere herein. As shown in FIG. 3, die 304 is positioned in an enclosure formed by heat spreader lid 302 and substrate 308. Furthermore, first and second TIMs 322 and 324 are each in contact with inner surface 330 of heat spreader lid 302. In this manner, first and second TIMs 322 and 324 provide for transfer of heat from die 304 to heat spreader lid 302. Furthermore, first and second TIMs 322 and 324 adhere heat spreader lid 302 to die 304 in a manner that reduces warping of package 300.

In step 410, a plurality of interconnect members is attached to a second surface of the substrate. In an embodiment, solder balls 320 are attached to solder ball pads on surface 312 of substrate 308 in conventional or proprietary manner. Solder balls 320 may be reflowed to attach package 300 to a printed circuit board (PCB). In alternative embodiments, other types of interconnect members may be used in place of solder balls 320, such as pins, posts, etc.

As such, in embodiments, one or more TIMs may be used to attach a die surface to a heat spreader lid. One or more of the TIMs may be selected for greater thermal transfer, while one or more others of the TIMs may be selected for higher modulus to increase package stiffness.

In another embodiment, a first TIM may be applied to interface a surface of the die with the surface of the heat spreader lid, and a second TIM may be applied to interface a surface of the package substrate directly with the surface of the heat spreader lid. In this manner, the first TIM may be selected to have lower thermal resistance than the second TIM to provide high heat transfer from the die to the heat spreader lid. Furthermore, the second TIM, which connects the substrate directly to the heat spreader lid, may be selected to have higher modulus than the first TIM to provide greater structural/mechanical stability for the package, reducing package warp.

For instance, FIG. 9 shows a step 902 that may be performed in place of step 406 of flowchart 400 (FIG. 4), according to an example embodiment. In step 902, the second TIM is applied to the first surface of the substrate to be separated from the die by a gap, the second TIM being connected between the first surface of the substrate and the inner surface of the heat spreader lid. Thus, step 902 enables a flip chip package to be formed that includes a first TIM that adheres a flip chip die to a heat spreader lid, and a second TIM that adheres a package substrate to the heat spreader lid.

FIG. 10 shows a cross-sectional side view of a flip chip package 1000, according to an example embodiment. Package 1000 may be assembled according to flowchart 400, with step 902 performed instead of step 406. As shown in FIG. 10, package 1000 is generally similar to package 300 of FIG. 3, except that a single TIM—first TIM 322—interfaces die 304 with heat spreader lid 302, and a second TIM 1002 interfaces substrate 308 with heat spreader lid 302. Note that in an alternative embodiment, multiple different TIMs may interface die 304 with heat spreader lid 302. As shown in FIG. 10, first TIM 322 covers the entirety of surface 328 of die 304, and is in contact with inner surface 330 of heat spreader lid 302. Second TIM 1002 is applied to surface 310 of substrate 308, and is in contact with inner surface 330 of heat spreader lid 302 (alternatively, second TIM 1002 may be applied to inner surface 330 instead of surface 310). As such, first TIM 322 adheres die 304 to heat spreader lid 302, and second TIM 1002 adheres substrate 308 to heat spreader lid 302. First TIM 322 may be selected to have a lower thermal resistance than second TIM 1002 to provide high thermal transfer from die 304 to heat spreader lid 302. Second TIM 1002 may be selected to have a higher modulus than first TIM 322 to provide greater stiffness/rigidity and adhesion, reducing warp of package 1000. Furthermore, by partially or fully surrounding die 304 in a ring, second TIM 1002 can reduce pressure on die 304 due to any warping of package 1000.

FIG. 11 shows a top view of flip chip package 1000, according to an example embodiment (heat spreader lid 302 is not visible in FIG. 11). As shown in FIG. 11, second TIM 1002 may partially surround die 322 in a partial or broken rectangular ring shape. In the example of FIG. 11, the rectangular ring shape of second TIM 1002 has two openings or breaks, but in other embodiments, may have fewer or greater numbers of openings or breaks. Furthermore, in another embodiment, the rectangular ring shape of second TIM 1002 may be continuous around die 304 (no breaks or openings). Still further, in other embodiments, second TIM 1002 may have other shapes than rectangular, including being round, or having other shapes mentioned elsewhere herein or otherwise known.

In the examples of FIGS. 10 and 11, second TIM 1002 is not in contact with die 304, being separated from die 304 by a gap 1004. In other embodiments, second TIM 1002 may be in contact with one or more sides of die 304.

Second TIM 1002 may be applied to substrate 308 and/or to heat spreader lid 302 prior to, or after mounting heat spreader lid 302 to substrate 308 in any manner, including being applied according to conventional or proprietary techniques.

In another embodiment, a first TIM may be applied to interface a surface of the die with the surface of the heat spreader lid, and a second TIM may be applied to interface a ring shaped stiffener between the surface of the package substrate and the surface of the heat spreader lid. In this manner, the first TIM may be selected to have lower thermal resistance than the second TIM to provide high heat transfer from the die to the heat spreader lid. Furthermore, the ring shaped stiffener and second TIM, which may be selected to have higher modulus than the first TIM, provide greater structural/mechanical stability for the package, reducing package warp.

Figure 12:
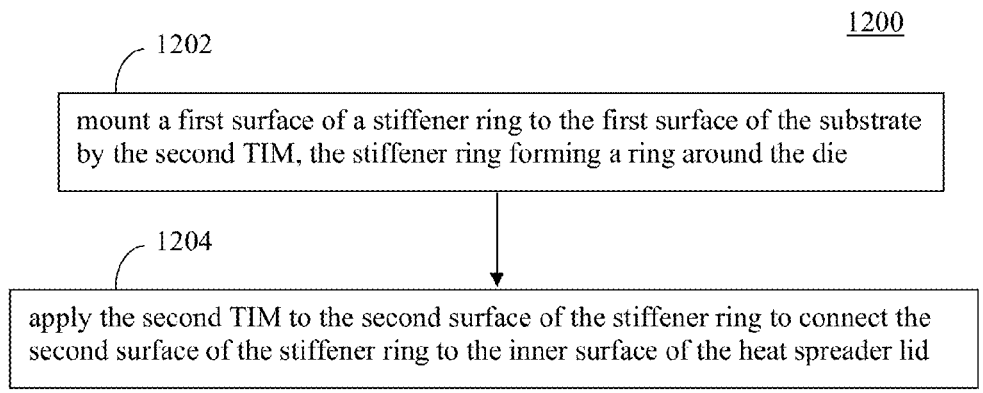
FIG. 12 shows a flowchart that may be performed in the flowchart of FIG. 4 to form a flip chip package that includes a first TIM that adheres a flip chip die to a heat spreader lid, and a second TIM that mounts a stiffener ring between a package substrate and the heat spreader lid, according to an example embodiment.
Figure 13:
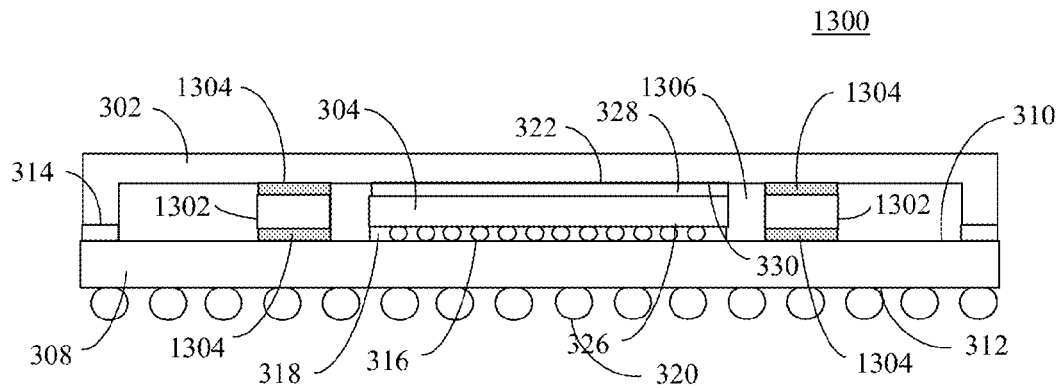
FIG. 13 shows a cross-sectional side view of a flip chip package that includes a first TIM that adheres a flip chip die to a heat spreader lid, and a second TIM that mounts a stiffener ring between a package substrate and the heat spreader lid, according to an example embodiment.

For instance, FIG. 12 shows a flowchart 1200 that may be performed in place of step 406 of flowchart 400 (FIG. 4), according to an example embodiment. Furthermore, FIG. 13 shows a cross-sectional side view of a flip chip package 1300, according to an example embodiment. As shown in FIG. 13, package 1300 is generally similar to package 300 of FIG. 3, except that a single TIM—first TIM 322—interfaces die 304 with heat spreader lid 302, and a second TIM 1302 mounts a ring-shaped stiffener 1302 between substrate 308 and heat spreader lid 302. Note that in an alternative embodiment, multiple different TIMs may interface die 304 with heat spreader lid 302. Flip chip package 1300 may be assembled according to flowchart 400, with flowchart 1200 being performed in place of step 406, for example. Flowchart 1200 is described as follows with reference to flip chip package 1300 of FIG. 13, for purposes of illustration.

Flowchart 1200 begins with step 1202. In step 1202, a first surface of a stiffener ring is mounted to the first surface of the substrate by the second TIM, the stiffener ring forming a ring around the die. For instance, as shown in FIG. 13, stiffener 1302 may be mounted to surface 310 of substrate 308 by a second TIM 1304. Second TIM 1304 may be applied to surface 310 in a ring around die 304, and stiffener 1302 may be mounted to second TIM 1304 on surface 310. Second TIM 1304 may be applied to surface 310 in any manner (e.g., as described elsewhere herein for TIMs), including being applied according to conventional or proprietary techniques. Subsequently, a first (lower) surface of stiffener 1302 may be positioned in contact with second TIM 1304 on surface 310 around die 304. For instance, stiffener 1302 may be mounted according to a pick-and-place tprocess, or in another manner, as would be known to persons skilled in the relevant art(s). In this manner, stiffener 1302 is attached to substrate 308 by second TIM 1304.

In step 1204, the second TIM is applied to the second surface of the stiffener ring to connect the second surface of the stiffener ring to the inner surface of the heat spreader lid. For instance, as shown in FIG. 13, second TIM 1304 may be applied to the second (upper) surface of stiffener 1302. Second TIM 1304 may be applied to stiffener 1302 in any manner (e.g., as described elsewhere herein for TIMs), including being applied according to conventional or proprietary techniques. Furthermore, second TIM 1304 may be applied to stiffener 1302 prior to or after step 1202. Subsequently, when heat spreader lid 302 is mounted to substrate 308, second TIM 1304 contacts inner surface 330 of heat spreader lid 302 so that second TIM 1304 adheres stiffener 1302 to heat spreader lid 302.

Thus, flowchart 1200 enables a flip chip package to be formed that includes a first TIM that adheres a flip chip die to a heat spreader lid, and a second TIM that adheres a stiffener ring between the package substrate and the heat spreader lid. In FIG. 13, first TIM 322 may be selected to have a lower thermal resistance than second TIM 1304 to provide high thermal transfer from die 304 to heat spreader lid 302. Second TIM 1304 may be selected to have a higher modulus than first TIM 322 so that the combination of second TIM 1304 and stiffener 1302 provides greater stiffness/rigidity and adhesion, reducing warp of package 1300. By partially or fully surrounding die 304 in a ring, second TIM 1304 and stiffener 1302 can reduce pressure on die 304 due to any warping of package 1300.

Figure 14:
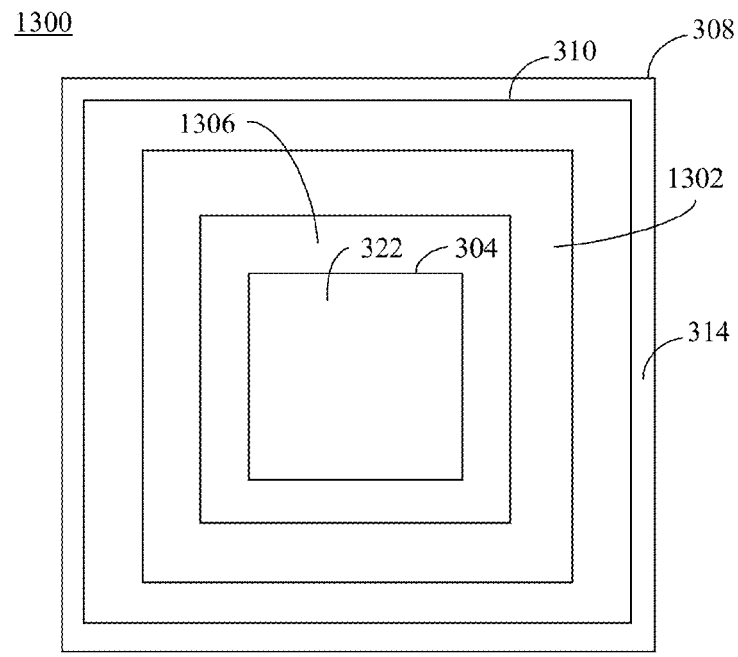
FIG. 14 shows a top view of a flip chip package that has a first TIM on a flip chip die surface, and a second TIM on a stiffener ring mounted to a package substrate surface (with a heat spreader lid of the flip chip package not visible), according to an example embodiment.

FIG. 14 shows a top view of flip chip package 1300, according to an example embodiment (heat spreader lid 302 is not visible in FIG. 14). As shown in FIG. 14, stiffener 1302 may surround die 322 in a continuous rectangular ring shape. In another embodiment, the rectangular ring shape of stiffener 1302 may have one or more breaks or openings. Still further, in other embodiments, stiffener 1302 may have other shapes than rectangular, including being round, or having other shapes mentioned herein or otherwise known.

In the examples of FIGS. 13 and 14, stiffener 1302 is not in contact with die 304, being separated from die 304 by a gap 1306. In other embodiments, stiffener 1302 may be sized to be in contact with one or more sides of die 304.

Stiffener 1302 may be made of one or more materials that are electrically conductive, or non-electrically conductive, including a polymer, a ceramic material, or a metal or combination of metals/alloy, including copper, aluminum, tin, nickel, gold, silver, iron, steel, etc.

Note that the embodiments described herein may be combined in any manner. Furthermore, embodiments are applicable to flip chip packages that include more than one IC die. Still further, embodiments may be applicable to dies mounted in non-flip chip orientations where a non-active surface of a die is mounted on a stiffener, heat spreader, or heat sink.

Embodiments enable desired thermal performance with low package warpage. Embodiments may be used in any size of IC package, including small, medium, and large sized pages. Embodiments reduce or eliminate a need to use thick core substrates to reduce package warpage, and reduce or eliminate a need to use a thick heat spreader to reduce package warpage. A thinner heat spreader lid may be used, which may also help to reduce a level of stress on solder bumps. Furthermore, standard package assembly lines may be used with little to no assembly line tooling modification.

Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the described embodiments should not be limited by any of the above-described exemplary embodiments, but should be defined only in accordance with the following claims and their equivalents.

What is claimed is:

1. An integrated circuit (IC) package, comprising:
   a substrate having opposing first and second surfaces;
   an IC die having opposing first and second surfaces, wherein the first surface of the die is flip chip mounted to the first surface of the substrate;
   a first thermal interface material (TIM) on the second surface of the die in a first pattern, the first TIM having a first thermal resistance;
   a second TIM on the second surface of the die in a second pattern, the second TIM having a second thermal resistance that is greater than the first thermal resistance and having a mechanical rigidity that is greater than a mechanical rigidity of the first TIM; and
   a heat spreader lid having an open end mounted to the first surface of the substrate such that the die is positioned in an enclosure formed by the heat spreader lid and substrate, the first TIM and the second TIM each being in contact with an inner surface of the heat spreader lid.

2. The IC package of claim 1, wherein the second TIM is an epoxy and the first TIM is an adhesive gel.

3. The IC package of claim 2, wherein a first portion of the second TIM is on the second surface of the die in the first pattern and in contact with the inner surface of the heat spreader lid, the IC package further comprising:
   a second portion of the second TIM that is positioned between and in contact with the first surface of the substrate and the inner surface of the heat spreader lid, and is separated from the die by a gap.

4. The IC package of claim 2, further comprising:
   a stiffener ring mounted to the first surface of the substrate by the second TIM and attached to the inner surface of the heat spreader lid by the second TIM, the stiffener ring forming a ring around the die.

5. The IC package of claim 1, wherein the first TIM is positioned on a central region of the second surface of the die, and the second TIM forms a ring-shaped pattern around the first TIM on the second surface of the die.

6. The IC package of claim 1, wherein the first TIM forms a cross-shaped pattern on a central region of the second surface of the die, and the second TIM is positioned on at least one corner region of the second surface of the die.

7. The IC package of claim 1, wherein the first TIM forms a first rectangular shaped pattern across a central region of the second surface of the die, and the second TIM forms first second and third rectangular shaped patterns respectively across first and second opposite edge regions on the second surface of the die.

8. The IC package of claim 1, wherein the first TIM is positioned on the second surface of the die on at least one determined hot spot of the die.

9. The IC package of claim 1, further comprising:
   at least one additional TIM on the second surface of the die and in contact with the inner surface of the heat spreader lid, the at least one additional TIM having a thermal resistance that is different than the first thermal resistance and the second thermal resistance.

10. A method for assembling an integrated circuit package, comprising:
    mounting a first surface of an integrated circuit die to a first surface of a substrate by a plurality of electrically conductive solder bumps;
    applying a first thermal interface material (TIM) on a second surface of the die in a first pattern, the first TIM having a first thermal resistance;
    applying a second TIM to a surface, the second TIM having a second thermal resistance that is greater than the first thermal resistance and having a mechanical rigidity that is greater than a mechanical rigidity of the first TIM;
    mounting an open end of a heat spreader lid to the first surface of the substrate such that the die is positioned in an enclosure formed by the heat spreader lid and substrate, the first TIM and the second TIM each being in contact with an inner surface of the heat spreader lid; and
    attaching a plurality of interconnect members to a second surface of the substrate.

11. The method of claim 10, wherein said applying a second TIM to a surface comprises:
    applying the second TIM on the second surface of the die in a second pattern.

12. The method of claim 10, wherein said applying a second TIM to a surface comprises:
    applying the second TIM to the first surface of the substrate to be separated from the die by a gap, the second TIM being connected between the first surface of the substrate and the inner surface of the heat spreader lid.

13. The method of claim 10, wherein said applying a second TIM to a surface comprises:
    mounting a first surface of a stiffener ring to the first surface of the substrate by the second TIM, the stiffener ring forming a ring around the die; and
    applying the second TIM to the second surface of the stiffener ring to connect the second surface of the stiffener ring to the inner surface of the heat spreader lid.

14. An integrated circuit package assembled according to the method of claim 10.

15. An integrated circuit (IC) package, comprising:
    a substrate having opposing first and second surfaces;
    an IC die mounted to the first surface of the substrate;
    a first thermal interface material (TIM) on a surface of the die, the first TIM having a first thermal resistance;
    a second TIM on the surface of the die, the second TIM having a second thermal resistance that is greater than the first thermal resistance and having a mechanical rigidity that is greater than a mechanical rigidity of the first TIM; and
    a heat spreader having a surface attached to the IC die by at least one of the first TIM or the second TIM, the first TIM and the second TIM each being in contact with the surface of the heat spreader lid.

16. The IC package of claim 15, wherein the second TIM is a solder and the first TIM is not a solder.

17. The IC package of claim 15, wherein the second TIM is spatially separated from the first TIM on the surface of the die.

18. The IC package of claim 15, wherein the second TIM is in contact with the first TIM on the surface of the die.

19. The IC package of claim 15, wherein the first TIM is an adhesive gel and the second TIM is an epoxy.

20. The IC package of claim 2, wherein the adhesive gel comprises cross-linked polymers.

\* \* \* \* \*